(12) United States Patent
Jacobsson et al.

(10) Patent No.: US 7,114,246 B2
(45) Date of Patent: Oct. 3, 2006

(54) METHOD FOR HANDLING BOARDS IN A COMPONENT MOUNTING MACHINE AND A COMPONENT MOUNTING MACHINE FOR PERFORMING THE METHOD

(75) Inventors: Nils Jacobsson, Järfälla (SE); Gunnar Carlsson, Täby (SE)

(73) Assignee: MYDATA automation AB, Bromma (SE)

( * ) Notice: Subject to any disclaimer, the term of this patent is extended or adjusted under 35 U.S.C. 154(b) by 225 days.

(21) Appl. No.: 10/474,255

(22) PCT Filed: Apr. 17, 2002

(86) PCT No.: PCT/SE02/00753

§ 371 (c)(1),
(2), (4) Date: Nov. 12, 2003

(87) PCT Pub. No.: WO02/089552

PCT Pub. Date: Nov. 7, 2002

(65) Prior Publication Data

US 2004/0098858 A1    May 27, 2004

(30) Foreign Application Priority Data

Apr. 27, 2001    (SE)    .................................... 0101501

(51) Int. Cl.
*B23P 19/00*    (2006.01)
*H05K 3/30*    (2006.01)

(52) U.S. Cl. ........................... 29/739; 29/832; 29/740; 29/564.1; 198/347.1; 414/222.1

(58) Field of Classification Search .................. 29/721, 29/739–742, 757, 760, 827, 830–832, 564, 29/564.1; 198/343.1, 345.1, 346.3, 347.1, 198/370.01–370.05; 414/222.09, 222.1, 414/269, 277, 283, 369
See application file for complete search history.

(56) References Cited

U.S. PATENT DOCUMENTS 4,725,182 A * 2/1988 Sakamoto et al. ..... 414/331.02
5,215,420 A * 6/1993 Hughes et al. ............... 414/217
5,829,942 A   11/1998 Beers ........................ 414/331
6,045,318 A * 4/2000 Mochida et al. ............. 414/609
6,199,272 B1 * 3/2001 Seto et al. ..................... 29/740
6,469,496 B1 * 10/2002 Khouw et al. ........... 324/158.1

FOREIGN PATENT DOCUMENTS

| JP | 60-153306 A | 8/1985 |
| JP | 60-153307 A | 8/1985 |
| JP | 60-153308 A | 8/1985 |

* cited by examiner

*Primary Examiner*—Minh Trinh
*Assistant Examiner*—Donghai D. Nguyen
(74) *Attorney, Agent, or Firm*—Birch, Stewart, Kolasch & Birch, LLP

(57) ABSTRACT

A component mounting machine is arranged to perform a method for handling boards in a component mounting machine includes the steps of moving a plurality of boards substantially simultaneously from a first plurality of cassettes, arranged in parallel at the machine, onto a board carrier; processing said plurality of boards by mounting components thereon; moving said plurality of boards substantially simultaneously and in parallel from the board carrier into a second plurality of board cassettes arranged in parallel at the machine and moving a next plurality of boards from said first plurality of cassettes onto the board carrier; repeating the steps of processing and moving the plurality of boards until said first plurality of cassettes are empty; and exchanging cassettes and repeating the method from step a.

19 Claims, 4 Drawing Sheets

METHOD FOR HANDLING BOARDS IN A COMPONENT MOUNTING MACHINE AND A COMPONENT MOUNTING MACHINE FOR PERFORMING THE METHOD

This application is the national phase under 35 U.S.C. §371 of PCT International Application No. PCT/SE 02/00753 which has an International filing date of Apr. 17, 2002, which designated the United States of America.

TECHNICAL FIELD

The present invention relates to a component mounting machine comprising a board carrier, a component mounting head, and a board handling apparatus comprising exchangeable board cassettes. The invention also relates to a method for handling the boards at the machine.

TECHNICAL BACKGROUND

Today many types of component mounting machines exist. However, the ones relevant for the present invention are those initially defined, i.e. those where the boards are provided from cassettes. A prior art machine of this kind has an input cassette and an output cassette for carrying unprocessed boards, i.e. boards which are to be provided with components, and processed boards, i.e. boards on which components have been placed, respectively. In operation a board is fetched from the input cassette and placed on the board carrier. Then the board carrier is moved along a first axis, or y-axis and the mounting head is moved along a second axis, or x-axis perpendicular to the first axis, for positioning the mounting head relative to the board, while components are mounted on the board. Finally, the thus processed board on the carrier is put to the output cassette and another unprocessed board is placed on the carrier. When the input cassette is empty, and, consequently, the output cassette is full, an operator replaces those cassettes with new ones. There are other principles for the very mounting of the components, such as fixing the board on the carrier and then moving the mounting head in both x and y directions, or moving only the carrier both in x and y directions. Before continuing to discuss this prior art, a few definitions are to be made for the purposes of this application. By "board" is meant any carrier on which components can be mounted. By "component" is meant an electronic element, which can be mounted on a board. By "mount" is meant to pick a component and place it on a board. Within the technical field of this invention one type of relevant component mounting machine is often called a pick and place machine.

Since the size of a cassette, i.e. the number of boards that it can hold, is more or less standardised and relatively limited, the time used by the operator to exchange the cassettes is substantial relative to the useful time for mounting components on all boards held in a cassette. This also causes a substantial idle time for the machine, during which it is unproductive. Of course it would be impossible to increase the height of a cassette towards infinity in order to decrease the idle time per board. Further, the number of operator interventions per time period is high. These problems are larger the smaller the number of components mounted on each board is.

A prior art effort to solve the above stated problems, consists of a board handling apparatus which comprises a loader for providing boards to a component mounting machine and an unloader for fetching boards from the machine. Each one of said loader and unloader has an upper cassette holder, a lower cassette holder, each one thereof holding a plurality of cassettes, and an elevator device. An input cassette is fetched from the upper cassette holder, placed on the elevator device, and positioned for loading boards. For each board which is removed from the input cassette the cassette is lowered one step. When the input cassette is empty it is further lowered, and put into the lower cassette holder, while another full input cassette is positioned for loading boards. Alternatively the elevator is raised step-by-step while loading boards.

However, while reducing the problems discussed above, this prior art solution adds other problems. One major problem is that it adds a substantial degree of complexity by introducing a mechanism for moving the cassettes horizontally between the cassette holders and the elevator device. Further, the board handling apparatus requires a substantial amount of space.

SUMMARY OF THE INVENTION

It is an object of the present invention to provide a component mounting machine having a board handling apparatus which reduces the time consumed by an operator per board for loading/unloading the machine with board cassettes, while avoiding, or at least substantially decreasing, the problems added by the prior art solution for handling several cassettes.

This (and other objects) is (are) achieved according to the present invention by providing a method and a machine having the features defined in the independent claims. Preferred embodiments are defined in the dependent claims.

Thus, in accordance with the invention the object is obtained by a component mounting machine comprising a board carrier; a component mounting head; and a board handling apparatus, said board handling apparatus comprising exchangeable board cassettes including a first plurality of board cassettes, which are arranged to provide unprocessed boards; and a second plurality of board cassettes, which are arranged to receive processed boards; and a board movement device, which is arranged to move a plurality of unprocessed boards in parallel and substantially simultaneously from said first plurality of cassettes onto said board carrier and to move a plurality of processed boards in parallel and substantially simultaneously from said board carrier into said second plurality of cassettes respectively.

In accordance with the present invention a first and a second plurality of cassettes are arranged at the machine for parallel handling of a plurality of boards. In other words two sets of cassettes, each set comprising two or more cassettes, are present. Boards are fed to and from the board carrier in parallel. This results in a greater number of boards available for the mounting operation than in the single cassette case, yet substantially less complex mechanics than in the case of the above discussed prior art board handling apparatus for handling a plurality of cassettes. Further, less time per board is spent by the operator for cassette exchange purposes in relation to the case of one input cassette and one output cassette.

A further advantage of the machine according to the present invention is that the mounting operation generally is more efficient, and in particular when it comes to machines wherein the board carrier is moved between a board handling position, where boards are loaded and unloaded, and a mounting position, where the actual mounting is performed. This is due to the plurality of boards loaded in the machine, i.e. placed on the board carrier. Then, the time per board used for moving the board carrier between the board handling position and the mounting position is divided by the number of boards carried by the board carrier. Thus, this invention is particularly advantageous for split-axes machines.

Additionally, the very loading operation is more efficient, since several boards are loaded/unloaded substantially simultaneously.

Further, in accordance with the present invention there is provided a method for handling boards in a component mounting machine comprising the steps of:

a) moving a plurality of boards substantially simultaneously from a first plurality of cassettes, arranged in parallel at the machine, onto a board carrier;

b) processing said plurality of boards by mounting components thereon;

c) moving said plurality of boards substantially simultaneously and in parallel from the board carrier into a second plurality of board cassettes arranged in parallel at the machine and moving a next plurality of boards from said first plurality of cassettes onto the board carrier;

g) repeating steps b-c until said first plurality of cassettes are empty; and h) exchanging cassettes and repeating the method from step a.

This method provides for the same advantages as the machine.

Further objects and advantages of the present invention will be discussed below by means of exemplary embodiments.

BRIEF DESCRIPTION OF THE DRAWINGS

Exemplifying embodiments of the invention will be described below with reference to the accompanying drawings, in which.

DESCRIPTION OF EMBODIMENTS

Figure 1:
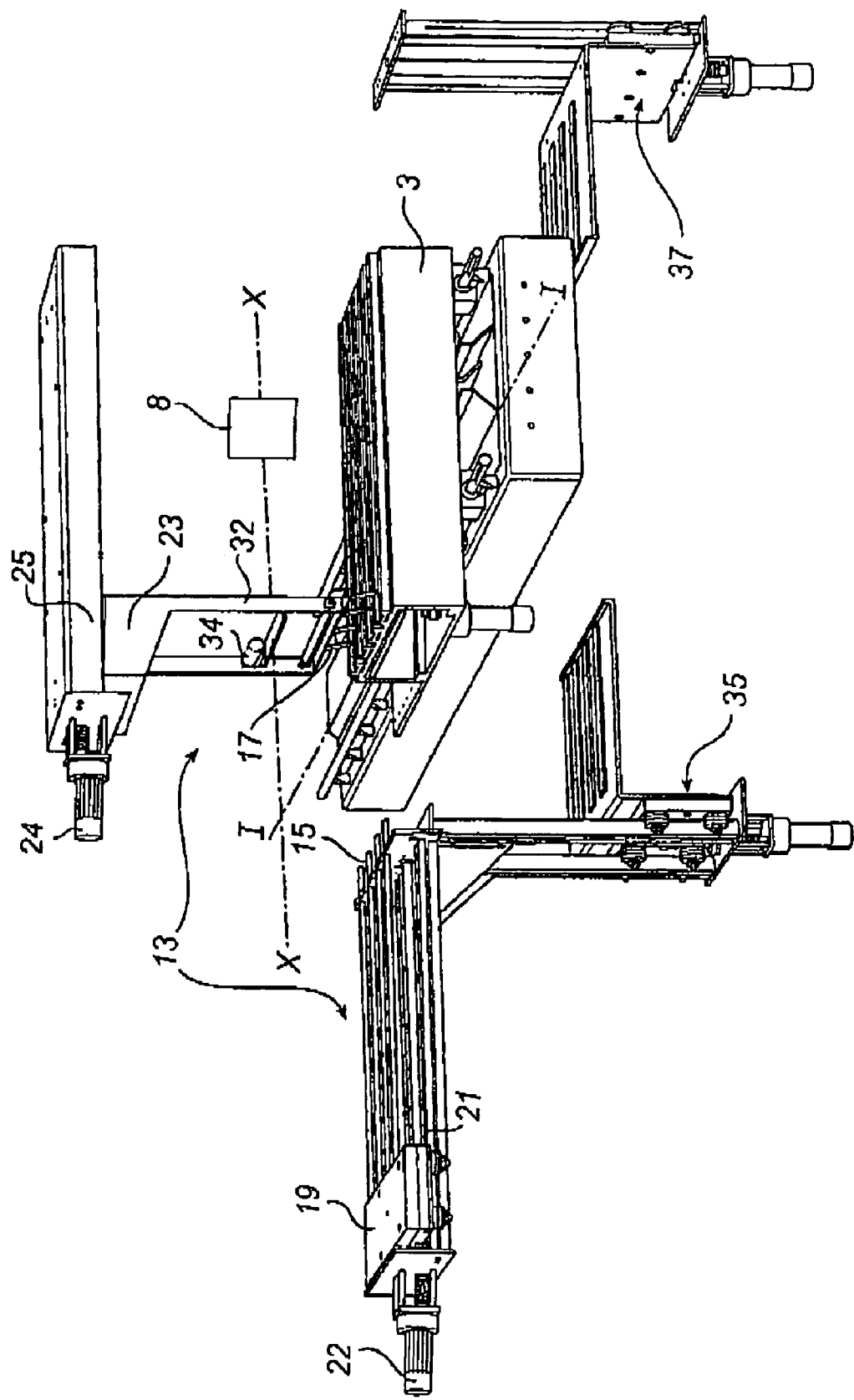
FIG. 1, in a perspective view, shows an embodiment of a board handling apparatus according to the present invention and parts of a component mounting machine at which the apparatus is arranged.
Figure 2:
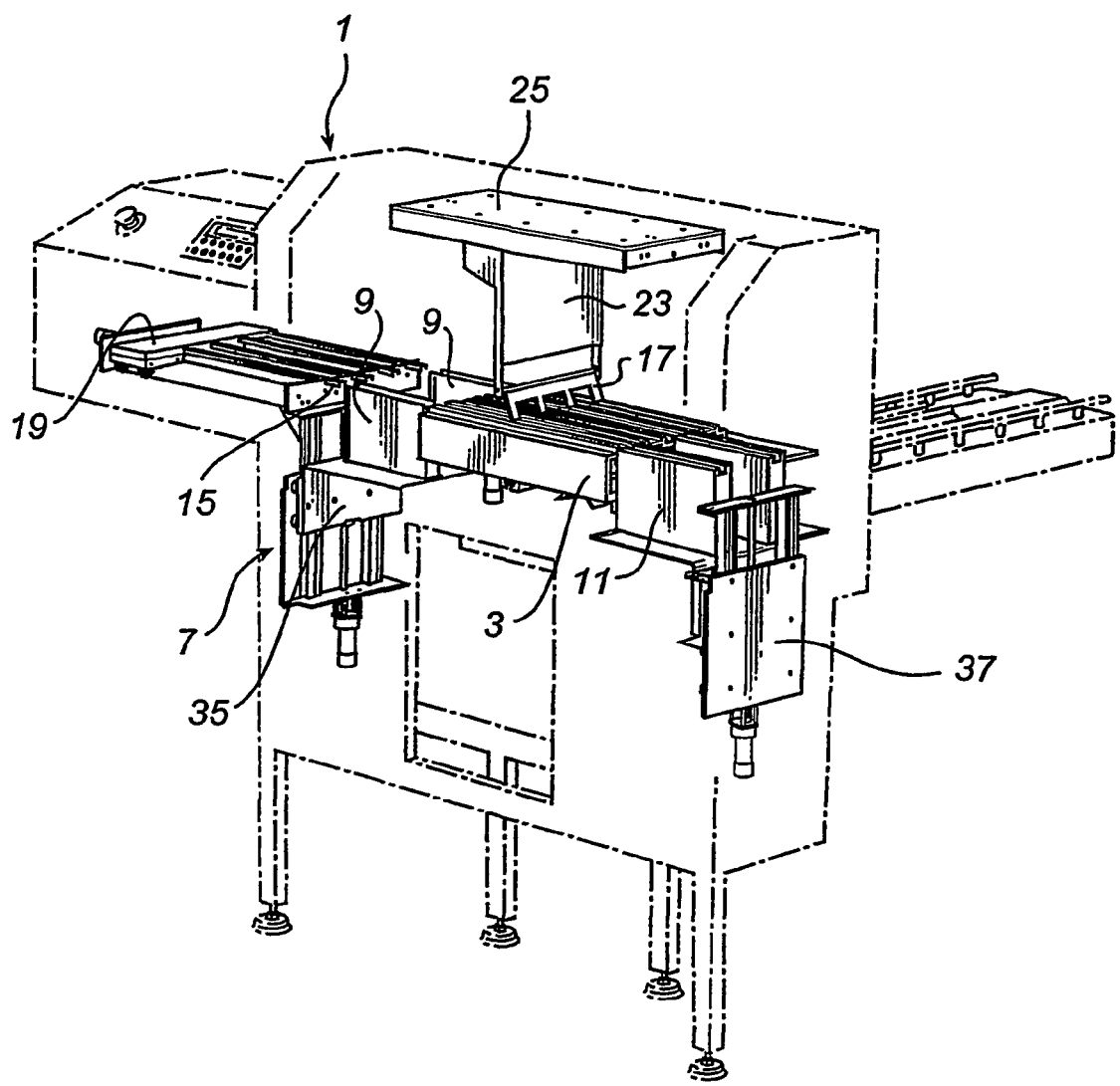
FIG. 2, in a perspective view, indicates an embodiment of a machine according to the present invention, which machine comprises the board handling apparatus of FIG. 1.
Figure 3:
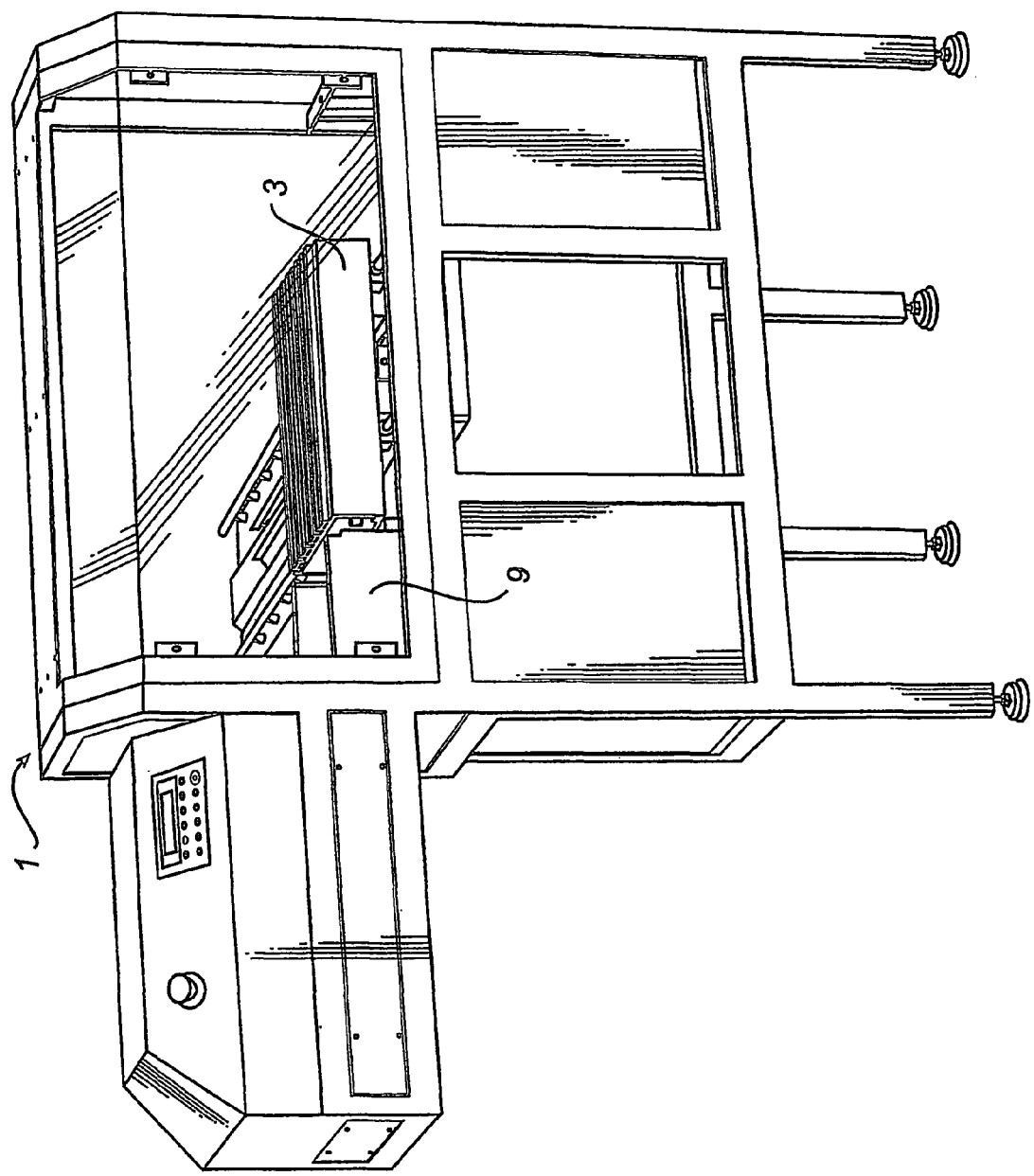
FIG. 3 fully shows the machine indicated in FIG. 2.
Figure 4:
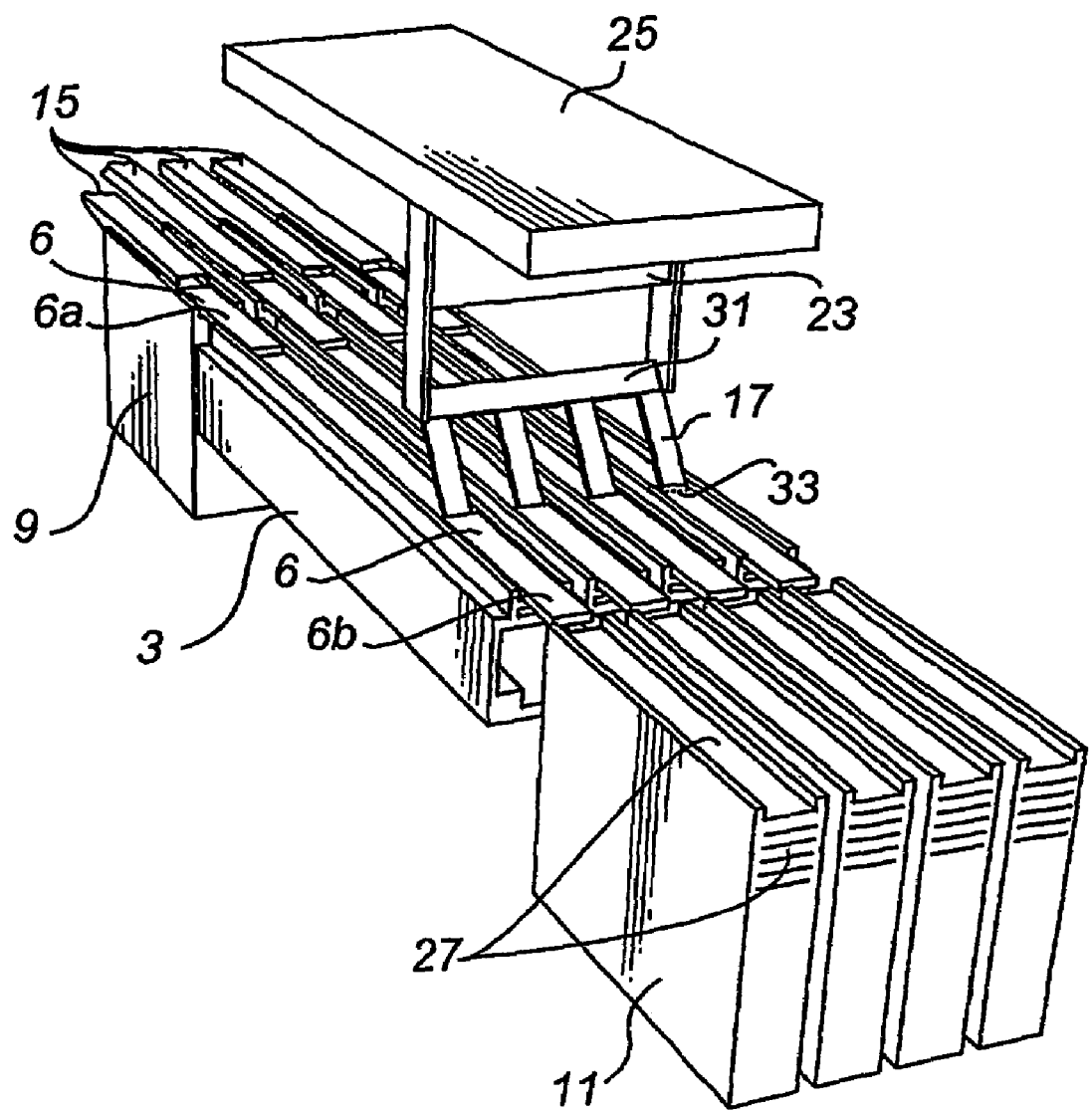
FIG. 4, in a perspective view, shows the very handling of the boards.

In a preferred embodiment of the machine according to the present invention the machine 1 comprises a board carrier 3; a board handling apparatus 7; and a component mounting head 8, which is not disclosed in detail; however, it is constructed in accordance with prior art. The machine 1 is a split axes machine, wherein the board carrier 3 is movable along a first axis, or Y-axis, I—I and the component mounting head is movable along a second axis, or X-axis, X—X, perpendicular to said first axis, for positioning the component mounting head relative to a board 6 carried by the board carrier 3. Below, since the board carrier in this embodiment can be regarded as a wagon movable along the Y-axis, it will be called Y-wagon, which will be recognized by the man skilled in the art. Further, the Y-wagon is displaceably mounted on an elongated support 5 for reciprocating movement along the length thereof, i.e. in along said Y-axis. In the figures the board carrier 3 is shown in a board handling position, at one end of the support 5, while it is moveable into a mounting area close to the other end of the support 5.

The board handling apparatus 7 comprises exchangeable board cassettes including a first plurality of board cassettes 9, which are arranged to provide unprocessed boards 6a, to the Y-wagon, and a second plurality of board cassettes 11, which are arranged to receive processed boards 6b, from the Y-wagon. Further, the board handling apparatus 7 comprises a board movement device 13. The board movement device 13, on one hand, is arranged to move a plurality of unprocessed boards 6a in parallel and substantially simultaneously from the first plurality of cassettes 9 onto the Y-wagon, and, on the other hand, is arranged to move a plurality of processed boards 6b in parallel and substantially simultaneously from the Y-wagon into the second plurality of cassettes 11. Of course, each unprocessed board 6a is associated with an individual cassette of the first plurality of cassettes 9 and each processed board 6b is associated with an individual cassette of the second plurality of cassettes 11. For sake of simplicity the boards supported on the top of the cassettes are shown, while, as known from prior art, each cassette of course comprises a number of compartments on top of each other, each compartment carrying a respective board.

More particularly, in the present embodiment, the board movement device 13 is arranged to push the unprocessed boards 6a out of the first plurality of cassettes 9 and onto the Y-wagon, and to push the processed boards 6b off the Y-wagon and into the second plurality of cassettes 11 respectively. In order to comply therewith the board movement device 13 comprises a first set of parallel movement members 15, and a second set of parallel movement members 17. The members 15 of the first set are jointly attached to a first feeding wagon 19, which is movable back and forth along a first elongated guide 21. Similarly, the members of said second set 17 are jointly attached to a second feeding wagon 23, which is movable back and forth along a second elongated guide 25. Said first and second guides 21, 25 are perpendicular to the Y-axis I—I. Each one of the feeding wagons 19, 23 is connected to a respective driving unit 22, 24, controlled by a control unit (not shown) for proper operation of the feeding wagons 19, 23. Even if the control unit is not explicitly shown, the skilled man will be able to construct it, by conventional means, in view of this description. Consequently, the movement members 15, 17 are reciprocatingly displaceable along the first plurality of cassettes 9 and across the Y-wagon respectively.

Each cassette 9, 11 holds several boards 6, for example 24 boards. Each board 6 in the cassette is supported by, for example, an individual plate 27. The plates 27 are arranged on top of each other and spaced by a small distance, enough for a board 6 to be readily inserted into the cavity between two plates 27. In order to comply with the task of pushing a board 6a out of a cassette, each one of said first movement members 15 is an elongated pushing element, or board pusher, which in this embodiment constitutes a horizontally mounted stick 15. The length of the stick 15 is greater than the length of the cassette 9. Thus, by driving the first feeding wagon 19 the sticks 15 are displaced into the first plurality of cassettes 9 and each stick 15 engage a corresponding unprocessed board 6a and pushes it out of the cassette 9 and onto the Y-wagon. There are as many sticks 15 as there are cassettes 9, in the shown embodiment the number is four. Thus, four boards 6a are fed in parallel and simultaneously onto the Y-wagon.

Said second movement members 17 in a sense has an opposite task, i.e. to push boards 6*b* from the Y-wagon and into the second plurality of cassettes 11. In order to comply therewith each movement member is a second elongated pushing element, or board pusher, 17 which is operative to push a respective one of the processed boards 6*b* from the Y-wagon and into the corresponding cassette 11. The second pushing elements 17 are implemented as elongated tongues. All of the tongues 17 are attached to, and preferably are protrusions of a plate 31, which is hingedly attached to a frame 32 comprised in the second feed wagon 23, such that the plate 31 is pivotable about its horizontal axis. The pivoting of the plate 31 is operated by a pivoting mechanism 34, which is also controlled by said control unit. When the processed boards 6*b* are to be moved from the Y-wagon, each tongue 17 is down pivoted so that at least a tip portion 33 thereof is positioned in the same plane as a respective processed board 6*b* on the Y-wagon, such that when the second feed wagon 23 is driven forth said tip portion 33 is engaged with the board 6*b* and pushes the same into a cassette 11, which is aligned with that board 6*b*.

Each plurality of cassettes 9, 11 are placed on an individual elevator device 35 and 37 respectively, which is comprised in said board handling apparatus 7. It is preferred to use two separate elevators 35, 37, considering that the first and second pluralities of cassettes 9, 11 are positioned at opposite sides of the Y-wagon as well as due to the possibility of driving them individually for the vertical displacement, i.e. elevation or lowering, of the cassettes 9, 11. Per se it would be possible to elevate, or lower, the first and second pluralities of cassettes 9, 11 by means of a common elevator mechanism, but at least in the present embodiment this would be a less attractive solution. The first and second plurality of cassettes 9, 11 respectively are detachably attached to their associated elevator device 35, 37. For example each cassette can be attached by a snap in arrangement or some other easily managed fastening means, which facilitates the operation of exchanging cassettes, which is performed by an operator. However, it is important that the positioning of each cassette at the elevator is accurate, in order not to cause problems for the board handling apparatus. This positioning could be obtained by known means used in prior art single cassette machines.

Above a preferred embodiment of the method according to the present invention has been described in conjunction with a few examples of alternative embodiments at the level of structural details. These embodiments should be seen as merely non-limiting examples. Many modifications will be possible within the scope of the invention as defined by the claims.

The invention claimed is:

1. A component mounting machine comprising:
 a board carrier;
 a component mounting head;
 a board handling apparatus, said board handling apparatus comprising exchangeable board cassettes including a first plurality of board cassettes, which are arranged to provide unprocessed boards; and a second plurality of board cassettes, which are arranged to receive processed boards; and
 a board movement device, which is arranged to move a plurality of unprocessed boards in parallel and substantially simultaneously from said first plurality of cassettes onto said board carrier and to move a plurality of processed boards in parallel and substantially simultaneously from said board carrier into said second plurality of cassettes respectively,
 wherein said board movement device comprises a first set of parallel movement members, which are displaceable into and out of said first plurality of cassettes and engageable with said plurality of unprocessed boards so as to perform said movement thereof onto said board carrier, and a second set of parallel movement members, which are reciprocatingly displaceable along said board carrier and engageable with said plurality of processed boards so as to perform said movement thereof into said second plurality of cassettes.

2. The component mounting machine as claimed in claim 1, wherein said first plurality of board cassettes are arranged at one side of the board carrier and said second plurality of board cassettes are arranged at an opposite side of the board carrier.

3. The component mounting machine as claimed in claim 2, wherein said first and second sets of parallel movement members are separately connected to a respective operating device for individual operation of each set of movement members.

4. The component mounting machine as claimed in claim 2, wherein said first and second sets of parallel movement members are connected in common to an operating device for common operation of both sets of members.

5. The component mounting machine as claimed in claim 2, wherein each one of said first set of movement members comprises a first pushing element, which is operative to push a respective one of said plurality of unprocessed boards out of the corresponding cassette.

6. The component mounting machine as claimed in claim 2, wherein each one of said second set of movement members comprises a second pushing element, which is operative to push a respective one of said plurality of processed boards into the corresponding cassette.

7. The component mounting machine as claimed in claim 6, wherein said pushing elements are pivotable, such that at least a tip portion of each pushing element is positioned in a horizontal plane of a respective processed board on the board carrier.

8. The component mounting machine as claimed in claim 1, said machine being a split axes machine, wherein the board carrier is movable along a first axis, and the component mounting head is movable along a second axis essentially perpendicular to said first axis, for positioning the component mounting head relative to a board carried by the board carrier.

9. The component mounting machine as claimed in claim 1, wherein the unprocessed and processed boards are lead frames.

10. The component mounting machine as claimed in claim 1, wherein said first and second sets of parallel movement members are separately connected to a respective operating device for individual operation of each set of movement members.

11. The component mounting machine as claimed in claim 1, wherein said first and second sets of parallel movement members are connected in common to an operating device for common operation of both sets of members.

12. The component mounting machine as claimed in claim 1, wherein each one of said first set of movement members comprises a first pushing element, which is operative to push a respective one of said plurality of unprocessed boards out of the corresponding cassette.

13. The component mounting machine as claimed in claim 1, wherein each one of said second set of movement members comprises a second pushing element, which is operative to push a respective one of said plurality of processed boards into the corresponding cassette.

14. The component mounting machine as claimed in claim 13, wherein said pushing elements are pivotable, such that at least a tip portion of each pushing element is positioned in a horizontal plane of a respective processed board on the board carrier.

15. A component mounting machine, comprising:
a board carrier;
a component mounting head;
a board handling apparatus, said board handling apparatus comprising exchangeable board cassettes including a first plurality of board cassettes, which are arranged to provide unprocessed boards; and a second plurality of board cassettes, which are arranged to receive processed boards; and
a board movement device, which is arranged to move a plurality of unprocessed boards in parallel and substantially simultaneously from said first plurality of cassettes onto said board carrier and to move a plurality of processed boards in parallel and substantially simultaneously from said board carrier into said second plurality of cassettes respectively,
said board handling apparatus further comprising a separate elevator device for each one of said first and second plurality of cassettes, wherein said first and second plurality of cassettes are detachably attached to each respective elevator device for individual vertical displacement of each plurality of cassettes.

16. A method for handling boards in a component mounting machine comprising the steps of:

a) moving a plurality of boards in parallel and substantially simultaneously from a first plurality of cassettes, arranged in parallel at the machine, onto a board carrier;
b) processing said plurality of boards by mounting components thereon;
c) moving said plurality of boards substantially simultaneously and in parallel from the board carrier into a second plurality of board cassettes arranged in parallel at the machine and moving a next plurality of boards from said first plurality of cassettes onto the board carrier;
g) repeating steps b to c until said first plurality of cassettes are empty; and
h) exchanging cassettes and repeating the method from step a.

17. The method as claimed in claim 16, wherein, in step c, said first plurality of boards and said next plurality of boards are moved simultaneously.

18. The method as claimed in claim 17, wherein step b comprises moving the board carrier along a first axis while moving a mounting head along a second axis essentially perpendicular to said first axis for positioning the mounting head relative to a board carried by the board carrier.

19. The method as claimed in claim 16, wherein step b comprises moving the board carrier along a first axis while moving a mounting head along a second axis essentially perpendicular to said first axis for positioning the mounting head relative to a board carried by the board carrier.

* * * * *